(12) United States Patent
Bryant et al.

(10) Patent No.: US 7,808,081 B2
(45) Date of Patent: Oct. 5, 2010

(54) STRAINED-SILICON CMOS DEVICE AND METHOD

(75) Inventors: Andres Bryant, Underhill, VT (US); Qiqing Ouyang, Yorktown Heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/619,511

(22) Filed: Jan. 3, 2007

(65) Prior Publication Data
US 2007/0111417 A1  May 17, 2007

Related U.S. Application Data

(62) Division of application No. 10/930,404, filed on Aug. 31, 2004, now Pat. No. 7,227,205.

(51) Int. Cl.
*H01L 29/06* (2006.01)
(52) U.S. Cl. .............. 257/616; 257/192; 257/E21.182; 257/E29.193
(58) Field of Classification Search .......... 257/E29.193, 257/192, 616, E21.182
See application file for complete search history.

(56) References Cited

U.S. PATENT DOCUMENTS

| | | | |
|---|---|---|---|
| 3,602,841 A | 8/1971 | McGroddy | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |

(Continued)

FOREIGN PATENT DOCUMENTS

WO   WO 03/094239 A1   11/2003

(Continued)

OTHER PUBLICATIONS

Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Kenneth A Parker
*Assistant Examiner*—Jay C Kim
(74) *Attorney, Agent, or Firm*—Scully, Scott, Murphy & Presser, P.C.; Vazken Alexanian

(57) ABSTRACT

The present invention provides a semiconductor device and a method of forming thereof, in which a uniaxial strain is produced in the device channel of the semiconductor device. The uniaxial strain may be in tension or in compression and is in a direction parallel to the device channel. The uniaxial strain can be produced in a biaxially strained substrate surface by strain inducing liners, strain inducing wells or a combination thereof. The uniaxial strain may be produced in a relaxed substrate by the combination of strain inducing wells and a strain inducing liner. The present invention also provides a means for increasing biaxial strain with strain inducing isolation regions. The present invention further provides CMOS devices in which the device regions of the CMOS substrate may be independently processed to provide uniaxially strained semiconducting surfaces in compression or tension.

1 Claim, 8 Drawing Sheets

U.S. PATENT DOCUMENTS

| | | | |
|---|---|---|---|
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy et al. |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,792,703 | A | 8/1998 | Bronner et al. |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,358,806 | B1 | 3/2002 | Puchner |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,476,462 | B2 | 11/2002 | Shimizu et al. |
| 6,492,216 | B1 | 12/2002 | Yeo et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,544,854 | B1 | 4/2003 | Puchner et al. |
| 6,583,000 | B1 | 6/2003 | Hsu et al. |
| 6,603,156 | B2 | 8/2003 | Rim |
| 6,605,498 | B1 * | 8/2003 | Murthy et al. ............ 438/197 |
| 6,621,131 | B2 * | 9/2003 | Murthy et al. ............ 257/408 |
| 6,787,421 | B2 | 9/2004 | Gilmer et al. |
| 6,867,428 | B1 | 3/2005 | Besser et al. |
| 6,911,379 | B2 | 6/2005 | Yeo et al. |
| 6,960,781 | B2 | 11/2005 | Currie et al. |
| 7,005,333 | B2 | 2/2006 | Li |
| 7,023,018 | B2 * | 4/2006 | Buss ........................... 257/63 |
| 7,166,528 | B2 * | 1/2007 | Kim et al. ................... 438/607 |
| 2001/0009784 | A1 | 7/2001 | Ma et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2002/0125502 | A1 | 9/2002 | Baba et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0036122 | A1 | 2/2004 | Aihara |
| 2004/0108558 | A1 | 6/2004 | Kwak et al. |
| 2004/0173815 | A1 * | 9/2004 | Yeo et al. .................... 257/192 |
| 2005/0139929 | A1 * | 6/2005 | Rost ........................... 257/369 |
| 2005/0184345 | A1 | 8/2005 | Lin et al. |

FOREIGN PATENT DOCUMENTS

WO    WO 03/105206 A1    12/2003

OTHER PUBLICATIONS

Rim, et al. "Characteristics and Device Design of Sub-100 nm Strained Si N- and PMOSFETs", 2002 Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Jeffrey A. Davis, et al., "Interconnect Limits on Gigascale Integration (GSI) in the $21^{st}$ Century", *Proceedings of the IEEE*, vol. 89, No. 3, pp. 305-324 (2001).

"Grand Challenges", *The International Technology Roadmap For Semiconductors*, pp. 9-15 (2002).

J. Cai, et al., Performance Comparison and Channel Length Scaling of Strained Si FETs on Si-on-Insulator (SGOI).

Thompson, S. et al., "A 90nm Logic Technology Featuring 50nm Strained Silicon Channel Transistors, 7 Layers of Cu Interconnects, Low k ILD, and 1 um2 SRAM Cell." International Electron Devices Meeting. Technical Digest. p. 61-64 (2002).

Ghani, T. et al., "A 90 nm High Volume Manufacturing Logic Technology Featuring Novel 45nm Gate Length Strained Silicon CMOS Transistors." International Electron Devices Meeting. Technical Digest. p. 978-980 (2003).

Thompson, Scott E., "A Logic Nanotechnology Featuring Strained-Silicon." IEEE Electron Devices Letters. vol. 25 No. 4 p. 191-193 (2004).

Ozturk, M.C. et al., "Ultra-shallow source/drain junctions for nanoscale CMOS using selective silicon-germanium technology" Junction Technology, 2001. IWJT. Extended abstracts of the 2nd Int'l workshop on Nov. 29-30, 2001, Piscataway, NJ, IEEE, Nov. 29, 2001, pp. 77-82.

Thompson S. E. et al., "A 90-nm logic technology featuring strained-silicon" IEEE Transactions on Electron Devices, IEEE Service Center, Piscataway, NJ vol. 51, No. 11, Nov. 2004, pp. 1790-1797.

Lim, J-S., et al., "Comparison of threshold-voltage shifts for uniaxial and biaxial tensile-stressed N-MOSFETs," IEEE Electron Device Letters, IEEE Service Center, NY, NY vol. 25, No. 11, Nov. 2004, pp. 731-733.

* cited by examiner

STRAINED-SILICON CMOS DEVICE AND METHOD

RELATED APPLICATION

This application is a divisional of U.S. application Ser. No. 10/930,404 filed Aug. 31, 2004.

CROSS REFERENCE TO RELATED APPLICATION

The present invention claims benefit of U.S. provisional patent application 60/582,678 filed Jun. 24, 2004, the entire content and disclosure of which is incorporated by reference.

FIELD OF THE INVENTION

The present invention relates to semiconductor devices having enhanced electron and hole mobilities, and more particularly, to semiconductor devices that include a silicon (Si)-containing layer having enhanced electron and hole mobilities. The present invention also provides methods for forming such semiconductor devices.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued complementary metal oxide semiconductor (CMOS) scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate strain into the Si lattice.

The application of strain changes the lattice dimensions of the silicon (Si)-containing substrate. By changing the lattice dimensions, the electronic band structure of the material is changed as well, The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. This results in changes in carrier transport properties, which can be dramatic in certain cases. The application of physical stress (tensile or compressive) can be further used to enhance the performance of devices fabricated on the Si-containing substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Strained silicon on relaxed SiGe buffer layer or relaxed SiGe-on-insulator (SGOI) has demonstrated higher drive current for both nFET [K. Rim, p. 98, VLSI 2002, B. Lee, IEDM 2002] and pFET [K. Rim, et al, p. 98, VLSI 2002] devices. Even though having strained silicon on SGOI substrates or strained silicon directly on insulator (SSDOI) can reduce the short-channel effects and some process related problems such as enhanced As diffusion in SiGe [S. Takagi, et al, p. 03-57, IEDM 2003; K. Rim et al, p. 3-49, IEDM 2003], the enhancement in the drive current starts to diminish as devices are scaled down to very short channel dimensions [Q. Xiang, et al, VLSI 2003; J. R. Hwang, et al, VLSI 2003]. The term "very short channel" denotes a device channel having a length of less than about 50 nm.

It is believed that the reduction in drive currents in very short channel devices results from source/drain series resistance and that mobility degradation is due to higher channel doping by strong halo doping, velocity saturation, and self-heating.

In addition, in the case of biaxial tensile strain, such as strained epitaxially grown Si on relaxed SiGe, significant hole mobility enhancement for pFET devices only occurs when the device channel is under a high (>1%) strain, which is disadvantageously prone to have crystalline defects. Further, the strain created by the lattice mismatch between the epitaxially grown Si atop the relaxed SiGe is reduced by stress induced by shallow trench isolation regions, wherein the effect of the shallow trench isolation regions is especially significant in the case of devices having a dimension from the gate edge to the end of the source/drain region on the order of about 500 nm or less. [T. Sanuki, et al, IEDM 2003].

Further scaling of semiconducting devices requires that the strain levels produced within the substrate be controlled and that new methods be developed to increase the strain that can be produced. In order to maintain enhancement in strained silicon with continued scaling, the amount of strain must be maintained or increased within the silicon-containing layer. Further innovation is needed to increase carrier mobility in pFET devices.

SUMMARY

The present invention provides a strained nFET device, in which improved carrier mobility is provided in a device channel subjected to a tensile uniaxial strain in a direction parallel to the device channel. The present invention also provides a strained pFET device, in which improved carrier mobility is provided by a compressive uniaxial strain imported to the device in a direction parallel to the device channel. The present invention further comprises a CMOS structure including pFET and nFET devices on the same substrate, in which the device channels of the pFET devices are under a uniaxial compressive strain and the device channels of the nFET devices are under a uniaxial tensile strain, both in a direction parallel to the device channels.

The foregoing is achieved in the present invention by forming a transistor on a semiconducting surface having a biaxial tensile strain, in which the semiconducting surface is epitaxially grown overlying a SiGe layer, or a biaxial compressive strain, in which the semiconducting surface is epitaxially grown overlying a silicon doped with carbon layer, and then inducing a uniaxial tensile or compressive strain on the device channel. The uniaxial tensile or compressive strain is produced by a strain inducing dielectric liner positioned atop the transistor and/or a strain inducing well abutting the device channel. Broadly, the inventive semiconducting structure comprises:

a substrate comprising a strained semiconducting layer overlying a strain inducing layer, wherein said strain inducing layer produces a biaxial strain in said strained semiconducting layer;

at least one gate region including a gate conductor atop a device channel portion of said strained semiconducting layer, said device channel portion separating source and drain regions adjacent said at least one gate conductor; and a strain inducing liner positioned on said at least one gate region, wherein said strain inducing liner produces a uniaxial strain to said device channel portion of said strained semiconducting layer underlying said at least one gate region.

The strain inducing layer may comprise SiGe, in which the biaxial strain in the strained semiconducting surface is in tension, or the strain inducing layer may comprise silicon doped with carbon, in which the biaxial strain of the strained semiconducting surface is in compression.

A tensile strain inducing liner positioned atop a transistor having a device channel in biaxial tensile strain produces a uniaxial tensile strain in the device channel, in which the uniaxial strain is in a direction parallel with the device channel and provides carrier mobility enhancements in nFET devices. A compressive strain inducing liner positioned atop a transistor having a device channel in a biaxial tensile strain produces a uniaxial compressive strain in the device channel, in which the uniaxial strain is in a direction parallel to the device channel and provides carrier mobility enhancements in pFET devices. A compressive strain inducing liner positioned atop a transistor having a device channel in biaxial compressive strain produces a uniaxial strain in the device channel, in which the uniaxial compressive strain is in a direction parallel to the device channel and provides carrier mobility enhancements in pFET devices.

Another aspect of the present invention is a semiconducting structure in which strain inducing wells adjacent the biaxially strained device channel induce a uniaxial compressive strain or a uniaxial tensile strain parallel to the device channel. Broadly, the inventive semiconducting structure comprises:

a substrate comprising a strained semiconducting layer overlying a strain inducing layer, wherein said strain inducing layer produces a biaxial strain in said strained semiconducting layer;

at least one gate region including a gate conductor atop a device channel portion of said strained semiconducting layer of said substrate, said device channel separating source and drain regions; and strain inducing wells adjacent said at least one gate region, wherein said strain inducing wells adjacent said at least one gate region produce a uniaxial strain to said device channel portion of said strained semiconducting layer.

Strain inducing wells comprising silicon doped with carbon positioned within a biaxial tensile strained semiconducting layer and adjacent a device channel produce a tensile uniaxial strain within the device channel, wherein the uniaxial strain is in a direction parallel to the device channel. The tensile uniaxial strain can provide carrier mobility enhancements in nFET devices.

Strain inducing wells comprising SiGe positioned within a biaxial compressively strained semiconducting layer and adjacent a device channel produce a compressive uniaxial strain within the device channel, wherein the uniaxial strain is in direction parallel to said device channel. The compressive uniaxial strain can provide carrier mobility enhancements in pFET devices.

Another aspect of the present invention is a complementary metal oxide semiconducting (CMOS) structure including nFET and pFET devices. Broadly, the inventive structure comprises:

a substrate comprising a compressively strained semiconducting surface and a tensile strained semiconducting surface, wherein said compressively strained semiconducting surface and said tensile strained semiconducting surface are strained biaxially;

at least one gate region atop said compressively strained semiconducting layer including a gate conductor atop a device channel portion of said compressively strained semiconducting layer of said substrate;

at least one gate region atop said tensile strained semiconducting layer including a gate conductor atop a device channel portion of said tensile strained semiconducting layer of said substrate;

a compressive strain inducing liner atop said at least one gate region atop said compressively strained semiconducting surface, wherein said compressive strain inducing liner produces a compressive uniaxial strain in said device channel portion of said compressively strained semiconducting layer, wherein said compressive uniaxial strain is in a direction parallel to said device channel portion of said compressively strained semiconducting surface; and a tensile strain inducing liner atop said at least one gate region atop said tensile strained semiconducting layer, wherein said tensile strain inducing liner produces a uniaxial strain in said device channel portion of said tensile strained semiconducting layer, wherein said tensile uniaxial strain is in a direction parallel to said device channel portion of said tensile strained semiconducting layer.

Another aspect of the present invention is a complementary metal oxide semiconducting (CMOS) structure including nFET and pFET devices. Broadly, the inventive structure comprises:

a substrate comprising a tensile strained semiconducting layer having a pFET device region and an nFET device region;

at least one gate region within said pFET device region including a gate conductor atop a pFET device channel portion of said tensile strained semiconducting layer;

at least one gate region within said nFET device region including a gate conductor atop an nFET device channel portion of said tensile strained semiconducting surface of said substrate;

a compressive strain inducing liner atop said at least one gate region in said pFET device region, wherein said compressive strain inducing liner produces a compressive uniaxial strain in said pFET device channel; and a tensile strain inducing liner atop said at least one gate region in said nFET device region, wherein said tensile strain inducing liner produces a uniaxial tensile strain in said nFET device channel.

The above described structure may further include strain inducing wells adjacent at least one gate region in the nFET device region and the pFET device region, wherein the strain inducing wells in the pFET device region increases compressive uniaxial strain and the strain inducing wells in the nFET device region increases tensile uniaxial strain.

Another aspect of the present invention is a method of forming the above-described semiconducting structure, which includes a stress inducing liner and/or strain inducing wells that provide a uniaxial strain within the device channel portion of the substrate. Broadly, the method of present invention comprises the steps of:

providing a substrate having at least one strained semiconducting surface, said at least one strained semiconducting surface having an internal strain in a first direction and a second direction having equal magnitude, wherein said first direction is within a same crystal plane and is perpendicular to said second direction;

producing at least one semiconducting device atop said at least one strained semiconducting surface, said at least one semiconducting device comprising a gate conductor atop a device channel portion of said semiconducting surface, said device channel separating source and drain regions; and forming a strain inducing liner atop said at least one gate region, wherein said strain inducing liner produces a uniaxial strain in said device channel, wherein said magnitude of strain in said first direction is different than said second direction within said device channel portion of said at least one strained semiconducting surface.

Another aspect of the present invention is a method of increasing the biaxial strain within the semiconducting layer. The biaxial strain within the semiconducting layer may be increased in compression or tension by forming an isolation region surrounding the active device region having an intrinsically compressive or tensile dielectric fill material. In accordance with the inventive method, the uniaxial strain may be induced by forming a set of strain inducing wells adjacent the at least one gate region instead of or in combination with, the strain inducing liner.

The present invention also provides improved carrier mobility in semiconducting devices formed on a relaxed substrate, wherein a uniaxial strain parallel to the device channel of a transistor is provided by the combination of a strain inducing liner positioned atop the transistor and a strain inducing well positioned adjacent to the device channel. Broadly the inventive semiconductor structure comprises:

a relaxed substrate;

at least one gate region including a gate conductor atop a device channel portion of said relaxed substrate, said device channel portion separating source and drain regions adjacent said at least one conductor;

strain inducing wells adjacent said at least one gate region; and a strain inducing liner positioned on said at least one gate regions, wherein said strain inducing liner and said strain inducing wells produce a uniaxial strain to said device channel portion of said relaxed portion of said substrate underlying said at least one gate region.

Another aspect of the present invention is a complementary metal oxide semiconducting (CMOS) structure including nFET and pFET devices, wherein the devices may be formed on a substrate having biaxially strained semiconducting surfaces and/or relaxed semiconducting surfaces. Broadly, one method for providing a CMOS structure formed on a substrate having both relaxed and biaxially strained semiconducting surfaces comprises providing a substrate having a first device region and a second device region, producing at least one semiconducting device atop a device channel portion of said substrate in said first device region and said second device region; and producing a uniaxial strain in said first device region and said second device region, wherein said uniaxial strain is in a direction parallel to said device channel of said first device region and said second device region. The first device region may comprise a biaxially strained semiconducting surface and the second device region may comprise a relaxed semiconducting surface.

In accordance with the present invention, producing a uniaxial strain in the first device region and the second device region further comprises processing the first device region and the second device region to provide a combination of strain inducing structures. The first device region may comprise a biaxially strained semiconducting surface and a strain inducing liner atop at least one semiconductor device, a biaxially strained semiconducting surface and strain inducing wells adjacent at least one semiconducting device, or a combination thereof. The second device region may comprise a relaxed substrate, a strain inducing liner atop at least one semiconducting device and strain inducing wells adjacent to at least one semiconducting device.

DETAILED DESCRIPTION OF THE INVENTION

Figure 1:
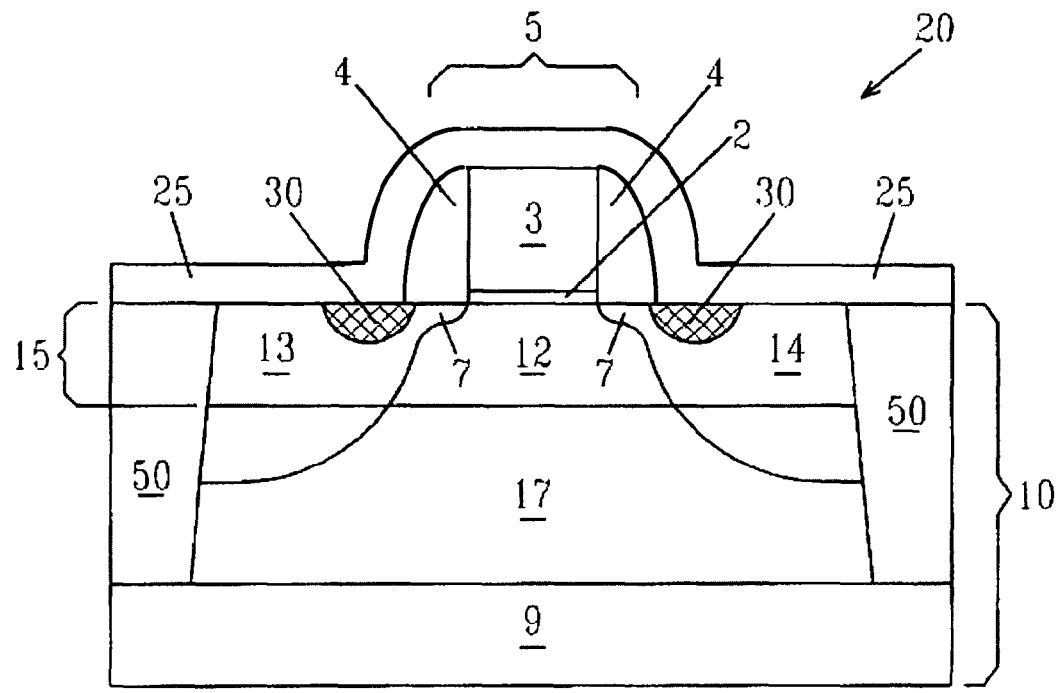
FIG. 1 is a pictorial representation (through a cross-sectional view) of one embodiment of the inventive semiconducting device including a nFET device channel having a uniaxial tensile strain, in which the uniaxial tensile strain is in a direction parallel with the device channel.

The present invention provides a CMOS structure including pFET and nFET devices, in which the symmetry of the unit lattice in the device channel of each device type can be broken down into three directions, where the lattice dimension (constant) of each direction is different by at least 0.05%. The lattice directions in the device channel include: parallel to the channel plane (x-direction), perpendicular to the channel plane (y-direction) and out of the channel plane (z-direction).

The present invention further provides a strained silicon nFET in which the lattice constant parallel to the nFET device channel is larger than the lattice constant perpendicular to the nFET device channel, wherein the lattice constant differential is induced by a tensile uniaxial strain parallel to the device channel. The present invention also provides a strained silicon pFET in which the lattice constant perpendicular to the pFET device channel is larger than the lattice constant parallel to the pFET device channel, wherein the lattice constant differential is induced by a compressive uniaxial strain parallel to the device channel. The present invention further provides a pFET and/or nFET device on a relaxed substrate surface wherein the combination of a strain inducing liner and a strain inducing well produce a uniaxial strain parallel to the device channel portion of the pFET and/or nFET device.

The present invention is now discussed in more detail referring to the drawings that accompany the present application. In the accompanying drawings, like and/or corresponding elements are referred to by like reference numbers. In the drawings, a single gate region is shown and described. Despite this illustration, the present invention is not limited to a structure including a single gate region. Instead, a plurality of such gate regions is contemplated.

Referring to FIG. 1, in one embodiment of the present invention, an n-type field effect transistor (nFET) 20 is provided having a uniaxial tensile strain in the device channel 12 of the layered stack 10, in which the uniaxial tensile strain is in a direction parallel to the length of the device channel 12. The length of the device channel 12 separates the extensions 7 of the source and drain regions 13, 14 of the device. The uniaxial tensile strain within the device channel 12 of the nFET 20 is produced by the combination of the biaxial tensile strained semiconducting layer 15 and a tensile strain inducing liner 25. The gate region 5 comprises a gate conductor 3 atop a gate dielectric 2.

The biaxial tensile strained semiconducting layer 15 is formed by epitaxially growing silicon atop a SiGe strain inducing layer 17. A biaxial tensile strain is induced in epitaxial silicon grown on a surface formed of a material whose lattice constant is greater than that of silicon. The lattice constant of germanium is about 4.2 percent greater than that of silicon, and the lattice constant of a SiGe alloy is linear with respect to its' germanium concentration. As a result, the lattice constant of a SiGe alloy containing fifty atomic percent germanium is about 2.1 times greater than the lattice constant of silicon. Epitaxial growth of Si on such a SiGe strain inducing layer 17 yields a Si layer under a biaxial tensile strain, with the underlying SiGe strain inducing layer 17 being essentially unstrained, or relaxed, fully or partially.

The term "biaxial tensile" denotes that a tensile strain is produced in a first direction parallel to the nFET device channel 12 and in a second direction perpendicular to the nFET device channel 12, in which the magnitude of the strain in the first direction is equal to the magnitude of the strain in the second direction.

The tensile strain inducing liner 25, preferably comprises $Si_3N_4$, and is positioned atop the gate region 5 and the exposed surface of the biaxial tensile strained semiconducting layer 15 adjacent to the gate region 5. The tensile strain inducing liner 25, in conjunction with the biaxial tensile strained semiconducting layer 15, produces a uniaxial tensile strain on the device channel 12 ranging from about 100 MPa to about 3000 MPa, in which the direction of the uniaxial strain on the device channel 12 is parallel to the length of the device channel 12.

Before the tensile strain inducing liner 25 is formed, the device channel 12 is in a biaxial tensile strain, wherein the magnitude of the strain produced in the direction perpendicular to the device channel 12 is equal the strain produced in the direction parallel to the device channel 12. The application of the tensile strain inducing liner 25 produces a uniaxial strain in the direction parallel to the device channel (x-direction) 12, wherein the magnitude of the tensile strain parallel to the device channel 12 is greater than the magnitude of the tensile strain perpendicular to the device channel 12. Further, the lattice constant within the nFET device 20 along the device channel 12 is greater than the lattice constant across the device channel 12.

Still referring to FIG. 1, in another embodiment of the present invention, tensile strain inducing wells 30 are positioned adjacent to the device channel 12 in respective source and drain regions 13, 14. The tensile strain inducing well 30 comprises silicon doped with carbon (Si:C) or silicon germanium doped with carbon (SiGe:C). The tensile strain inducing wells 30 comprising intrinsically tensile Si:C can be epitaxially grown atop a recessed portion of the biaxial tensile strained semiconducting layer 15. The term "intrinsically tensile Si:C layer" denotes that a Si:C layer is under an internal tensile strain, in which the tensile strain is produced by a lattice mismatch between the smaller lattice dimension of the Si:C and the larger lattice dimension of the layer on which the Si:C is epitaxially grown. The tensile strain inducing wells 30 produce a uniaxial tensile strain within the device channel 12 in a direction parallel to the nFET device channel 12.

In one embodiment, the tensile strain inducing wells 30 may be omitted when the tensile strain inducing liner 25 is provided. In another embodiment of the present invention, the tensile strain inducing liner 25 may be omitted when the tensile strain inducing wells 30 are provided. In yet another embodiment, both the tensile strain inducing wells 30 and the tensile strain inducing liner 25 are employed. The method for forming the inventive nFET 20 is now described in greater detail.

In a first process step, a layered stack 10 is provided comprising a biaxial tensile strained semiconducting layer 15. The layered stack 10 may include: tensile strained Si on SiGe, strained Si on SiGe-on-insulator (SSGOI) or tensile strained Si directly on insulator (SSDOI). In a preferred embodiment, layered stack 10 comprises tensile SSGOI having a silicon-containing biaxial tensile strained semiconducting layer 15 atop a SiGe strain inducing layer 17.

In a first process step, a SiGe strain inducing layer 17 is formed atop a Si-containing substrate 9. The term "Si-containing layer" is used herein to denote a material that includes silicon. Illustrative examples of Si-containing materials include, but are not limited to: Si, SiGe, SiGeC, SiC, poly-silicon, i.e., polySi, epitaxial silicon, i.e., epi-Si, amorphous Si, i.e., a:Si, SOI and multilayers thereof. An optional insulating layer may be positioned between the SiGe strain inducing layer 17 and the Si-containing substrate 9.

The SiGe strain inducing layer 17 is formed atop the entire Si-containing substrate 10 using an epitaxial growth process or by a deposition process, such as chemical vapor deposition (CVD). The Ge content of the SiGe strain inducing layer 17 typically ranges from 5% to 50%, by atomic weight %, with from 10% to 20% being even more typical. Typically, the SiGe strain inducing layer 17 can be grown to a thickness ranging from about 10 nm to about 100 nm.

The biaxial tensile strained semiconducting layer 15 is then formed atop the SiGe layer 17. The biaxial tensile strained semiconducting layer 15 comprises an epitaxially grown Si-containing material having lattice dimensions that are less than the lattice dimensions of the underlying SiGe layer 17. The biaxial tensile strained semiconducting layer 15 can be grown to a thickness that is less than its critical thickness. Typically, the biaxially tensile strained semiconducting layer 15 can be grown to a thickness ranging from about 10 nm to about 100 nm, Alternatively, a biaxial tensile strained semiconducting layer 15 can be formed directly atop an insulating layer to provide a strained silicon directly on insulator (SSDOI) substrate. In this embodiment, a biaxial tensile strained semiconducting layer 15 comprising epitaxial Si is grown atop a wafer having a SiGe surface. The biaxial tensile strained semiconducting layer 15 is then bonded to a dielectric layer of a support substrate using bonding methods, such as thermal bonding. Following bonding, the wafer having a SiGe surface and the SiGe layer atop the strained Si layer are removed using a process including smart cut and etching to provide a biaxial tensile strained semiconducting layer 26 directly bonded to a dielectric layer. A more detailed description of the formation of a strained Si directly on insulator substrate 105 having at least a biaxial tensile strained semiconducting layer 15 is provided in co-assigned U.S. Pat. No. 6,603,156 entitled STRAINED Si ON INSULATOR STRUCTURES, the entire content of which is incorporated herein by reference.

Following the formation of the stacked structure 10 having a biaxial tensile strained semiconducting layer 15, nFET devices 20 are then formed using conventional MOSFET processing steps including, but not limited to: conventional gate oxidation pre-clean and gate dielectric 2 formation; gate electrode 3 formation and patterning; gate reoxidation; source and drain extension 7 formation; sidewall spacer 4 formation by deposition and etching; and source and drain 13, 14 formation.

In a next process step, a tensile strain inducing liner 25 is then deposited at least atop the gate region 5 and the exposed surface of the biaxial tensile strained semiconducting layer 15 adjacent to the gate region 5. The tensile strain inducing liner 25 in conjunction with the biaxial tensile strained semiconducting layer 15 produces a uniaxial tensile strain within the device channel 12 of the nFET device having a direction parallel with the device channel 12. The tensile strain inducing liner 25 may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The tensile strain inducing liner 25 may have a thickness ranging from about 10 nm to about 500 nm, preferably being about 50 nm. The tensile strain inducing liner 25 may be deposited by plasma enhanced chemical vapor deposition (PECVD) or rapid thermal chemical vapor deposition (RTCVD).

Preferably, the tensile strain inducing liner 25 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state of the nitride stress including liners deposited by PECVD can be controlled by changing the deposition conditions to alter the reaction rate within the deposition chamber. More specifically, the stress state of the deposited nitride strain inducing liner may be set by changing the deposition conditions such as: $SiH_4/N_2$/He gas flow rate, pressure, RF power, and electrode gap.

In another example, rapid thermal chemical vapor deposition (RTCVD) can provide nitride tensile strain inducing liners 25 having an internal tensile strain. The magnitude of the internal tensile strain produced within the nitride tensile strain inducing liner 25 deposited by RTCVD can be controlled by changing the deposition conditions. More specifically, the magnitude of the tensile strain within the nitride tensile strain inducing liner 25 may be set by changing deposition conditions such as: precursor composition, precursor flow rate and temperature.

In another embodiment of the present invention, tensile strain inducing wells 30 may be formed following the formation of the nFET devices 20 and prior to the deposition of the tensile strain inducing liner 25. In a first process step, a recess is formed within the portion of the biaxially tensile strained semiconducting layer 15, in which the source and drain regions 13, 14 are positioned. The recess may be formed using photolithography and etching. Specifically an etch mask, preferably comprising a patterned photoresist, is formed atop the surface of the entire structure except the portion of the biaxially tensile strained semiconducting layer 15 adjacent the gate region. A directional (anisotropic) etch then recesses the surface of the biaxially tensile strained semiconducting layer 15 overlying the source and drain regions 13, 14 to a depth of about 10 nm to about 300 nm from the surface on which the gate region 5 is positioned.

In a preferred embodiment, the tensile strain inducing wells 30 encroach underneath the sidewall spacers 4 that abut the gate electrode 3 in the gate region 5. By positioning the tensile strain inducing wells 30 closer to the device channel 12, the strain produced along the device channel 12 is increased. The tensile strain inducing wells 30 may be positioned in closer proximity to the device channel 12 by an etch process including a first directional (anisotropic) etch followed by an non-directional (isotropic) etch, in which the non-directional etch undercuts the sidewall spacers 4 to provide a recess encroaching the device channel 12.

In a next process step, silicon doped with carbon (Si:C) is then epitaxially grown atop the recessed surface of the biaxial tensile strained semiconducting layer 15 overlying the source and drain regions 13, 14 forming the tensile strain inducing wells 30. The epitaxially grown Si:C is under an internal tensile strain (also referred to as an intrinsic tensile strain), in which the tensile strain is produced by a lattice mismatch between the smaller lattice dimension of the epitaxially grown Si:C and the larger lattice dimension of the recessed surface of the biaxial tensile strained semiconducting layer 15 on which the Si:C is epitaxially grown. The tensile strain inducing wells 30 produce a uniaxial tensile strain within the device channel 12 of the nFET device 20 having a direction parallel with the device channel 12. Although Si:C is preferred, any intrinsically tensile material may be utilized, such as Si, intrinsically tensile nitrides and oxides, so long as a uniaxial tensile strain is produced within the device channel 12.

In another embodiment of the present invention, a tensile strain inducing isolation region 50 is then formed comprising an intrinsically tensile dielectric fill, wherein the intrinsically tensile dielectric fill increases the magnitude of the strain within the biaxially tensile strained semiconducting layer 15 by about 0.05 to about 1%. The isolation regions 50 are formed by first etching a trench using a directional etch process, such as reactive ion etch. Following trench formation, the trenches are then filled with a dielectric having an intrinsic tensile strain, such as nitrides or oxides deposited by chemical vapor deposition. The deposition conditions for producing the intrinsically tensile dielectric fills are similar to the deposition conditions disclosed above for forming the tensile strained dielectric liner 25. A conventional planarization process such as chemical-mechanical polishing (CMP) may optionally be used to provide a planar structure.

Figure 2:
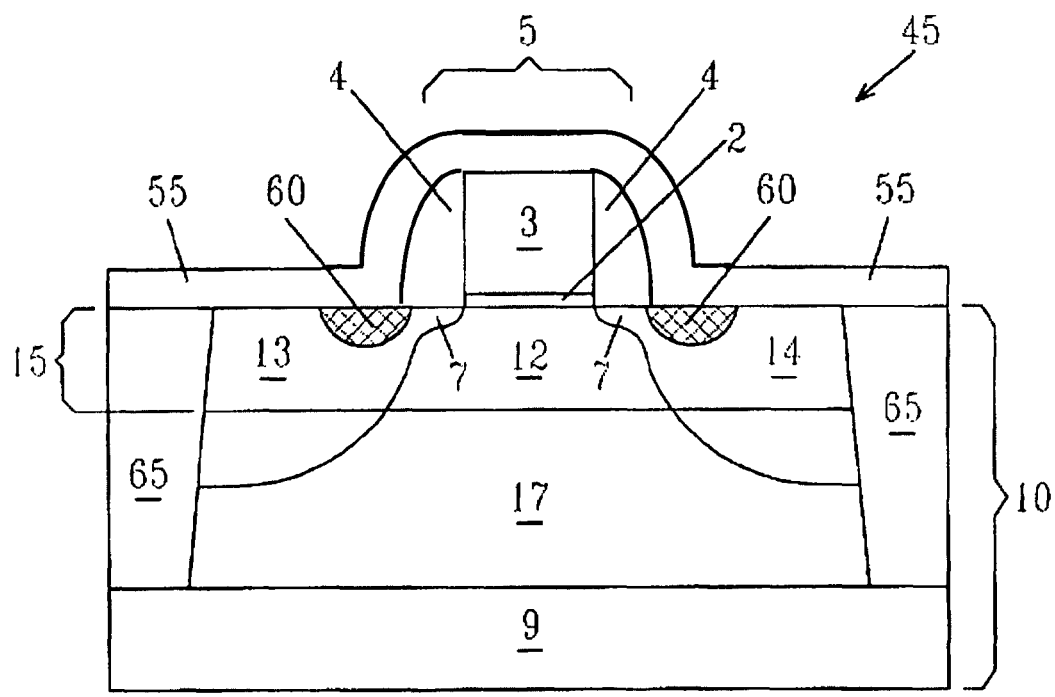
FIG. 2. is a pictorial representation (through a cross-sectional view) of another embodiment of the inventive semiconducting device including a pFET device channel having a uniaxial compressive strain atop a SiGe layer, in which the uniaxial compressive strain is in a direction parallel to the device channel.

Referring to FIG. 2 and in another embodiment of the present invention, a p-type field effect transistor (pFET) 45 is provided having a uniaxial compressive strain in the device channel 12 of the substrate 10, in which the uniaxial compressive strain is in a direction parallel to the length of the device channel 12. In this embodiment, the uniaxial compressive strain is produced by the combination of the biaxial tensile strained semiconducting layer 15 and a compressive strain inducing liner 55.

The biaxial tensile strained semiconducting layer 15 is epitaxially grown Si atop a SiGe strain inducing layer 17 similar to the biaxial tensile strained semiconducting layer 15 described above with reference to FIG. 1. The biaxial tensile strained semiconducting layer 15, can comprise epitaxial silicon grown atop a SiGe strain inducing layer 17, in which the Ge concentration of the SiGe strained inducing layer 17 is greater than 5%.

Referring back to FIG. 2, the compressive strain inducing liner 55, preferably comprises $Si_3N_4$, and is positioned atop the gate region 5 and the exposed surface of the biaxial tensile strained semiconducting layer 15 adjacent to the gate region 5. The compressive strain inducing liner 55 in conjunction with the biaxial tensile strained semiconducting layer 15 produces a uniaxial compressive strain on the device channel 12 ranging from about 100 MPa to about 2000 MPa, in which the direction of the uniaxial strain is parallel to the length of the device channel 12.

Before the compressive strain inducing liner 55 is formed, the device channel 12 is in a biaxial tensile strain, wherein the magnitude of the tensile strain produced in the direction perpendicular to the device channel 12 is equal the tensile strain produced in the direction parallel to the device channel 12. The application of the compressive strain inducing liner 55 produces a uniaxial compressive strain in a direction parallel to the device channel 12. Therefore, the lattice constant within the pFET device 45 across the device channel 12 is greater than the lattice constant along the device channel 12.

Still referring to FIG. 2, and in another embodiment of the present invention, compressive strain inducing wells 60 are positioned adjacent the device channel 12 in respective source and drain regions 13, 14. The compressive strain inducing wells 60 comprising intrinsically compressive SiGe can be epitaxially grown atop a recessed portion of the biaxial tensile strained semiconducting layer 15. The term "intrinsically compressive SiGe layer" denotes that a SiGe layer is under an intrinsic compressive strain (also referred to as an intrinsic compressive strain), in which the compressive strain is produced by a lattice mismatch between the larger lattice dimension of the SiGe and the smaller lattice dimension of the layer on which the SiGe is epitaxially grown. The compressive strain inducing wells 60 produce a uniaxial compressive strain within the device channel 12. The uniaxial compressive strain within the device channel 12 can be increased by positioning the compressive strain inducing wells 60 in close proximity to the device channel. In one preferred embodiment, the compressive strain inducing wells 60 encroach underneath the sidewall spacers 4 that abut the gate electrode 3 in the gate region 5.

The method for forming the inventive pFET 45 is now described. In a first process step, a layered structure 10 is provided having a biaxial tensile strained semiconducting layer 15. In one embodiment, the layered structure 10 comprises a biaxial tensile strained semiconducting layer 15 overlying a SiGe strain inducing layer 17, in which the SiGe strain inducing layer 17 is formed atop a Si-containing substrate 9. The Si-containing substrate 9 and the SiGe layer 17 are similar to the Si-containing substrate 9 and the SiGe layer 17 described above with reference to FIG. 1.

Following the formation of the layered structure 10, pFET devices 45 are then formed using conventional processes. The pFET devices 45 are formed using MOSFET processing similar to those for producing the nFET devices 20, as described with reference to FIG. 1, with the exception that the source and drain regions 13, 14 are p-type doped.

Referring back to FIG. 2, in a next process step, a compressive strain inducing liner 55 is then deposited at least atop the gate region 5 and the exposed surface of the biaxial tensile strained semiconducting layer 15 adjacent to the gate region 5. The compressive strain inducing liner 55 may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The compressive strain inducing liner 55 may have a thickness ranging from about 10 nm to about 100 nm, preferably being about 50 nm. The compressive strain inducing liner 55 may be deposited by plasma enhanced chemical vapor deposition (PECVD).

Preferably, the compressive strain inducing liner 55 comprises a nitride, such as $Si_3N_4$, wherein the process conditions of the deposition process are selected to provide an intrinsic compressive strain within the deposited layer. For example, plasma enhanced chemical vapor deposition (PECVD) can provide nitride strain inducing liners having a compressive internal strain. The stress state of the deposited nitride strain inducing liner may be set by changing the deposition conditions to alter the reaction rate within the deposition chamber, in which the deposition conditions include $SiH_4/N_2$/He gas flow rate, pressure, RF power, and electrode gap.

In another embodiment of the present invention, SiGe compressive strain inducing wells 60 may be formed following the formation of the pFET devices 45 and prior to the deposition of the compressive strain inducing liner 55. In a first process step, a recess is formed within the portion of the biaxial tensile strained semiconducting layer 15 adjacent to the gate region 5, in which the source and drain regions 13, 14 are positioned. The recess may be formed using photolithography and etching. Specifically an etch mask, preferably comprising patterned photoresist, is formed atop the surface of the entire structure except the portion of the biaxial tensile strained semiconducting layer 15 adjacent the gate region. A directional etch process then recesses the surface of the biaxial tensile strained semiconducting layer 15 overlying the source and drain regions 13, 14 to a depth of about 10 nm to about 300 nm from the surface on which the gate region 5 is positioned. In a preferred embodiment, the compressive strain inducing wells 60 may be positioned in closer proximity to the device channel by an etch process including a first directional (anisotropic) etch followed by a non-directional (isotropic) etch, in which the non-directional etch undercuts the sidewall spacers 4 to provide a recess encroaching the device channel 12. By positioning the compressive strain inducing wells 60 closer to the device channel 12, the strain produced along the device channel 12 is increased.

In a next process step, SiGe is then epitaxially grown atop the recessed surface of the biaxial tensile strained semiconducting layer 15 overlying the source and drain regions 13, 14 forming the compressive strain inducing wells 60. The epitaxially grown SiGe is under an internal compressive strain (also referred to as an intrinsic compressive strain), in which the compressive strain is produced by a lattice mismatch between the larger lattice dimension of the epitaxially grown SiGe and the smaller lattice dimension of the recessed surface of the biaxial tensile strained semiconducting layer 15, on which the SiGe is epitaxially grown. The compressive strain inducing wells 60 produce a uniaxial compressive strain within the device channel 12 of the pFET device 45 having a direction parallel to the device channel 12.

In one embodiment, the compressive strain inducing wells 60 may be omitted when the compressive strain inducing liner 55 is provided. In another embodiment of the present invention, the compressive strain inducing liner 55 may be omitted when the compressive strain inducing wells 60 are provided.

In another embodiment of the present invention, a compressive strain inducing isolation region 65 is formed comprising an intrinsically compressive dielectric fill, wherein the intrinsically compressive dielectric fill increases the magnitude of the strain in the biaxial tensile strained semiconducting layer 15 by about 0.05 to about 1%. The compressive strain inducing isolation regions 65 are formed by first etching a trench using a directional etch process, such as reactive ion etch. Following trench formation, the trench is then filled with a dielectric having an intrinsic compressive strain, such as nitrides or oxides deposited by chemical vapor deposition. The deposition conditions for producing the compressive strain inducing dielectric fill are similar to the deposition conditions disclosed above for forming the compressive strained dielectric liner 55.

Figure 3:
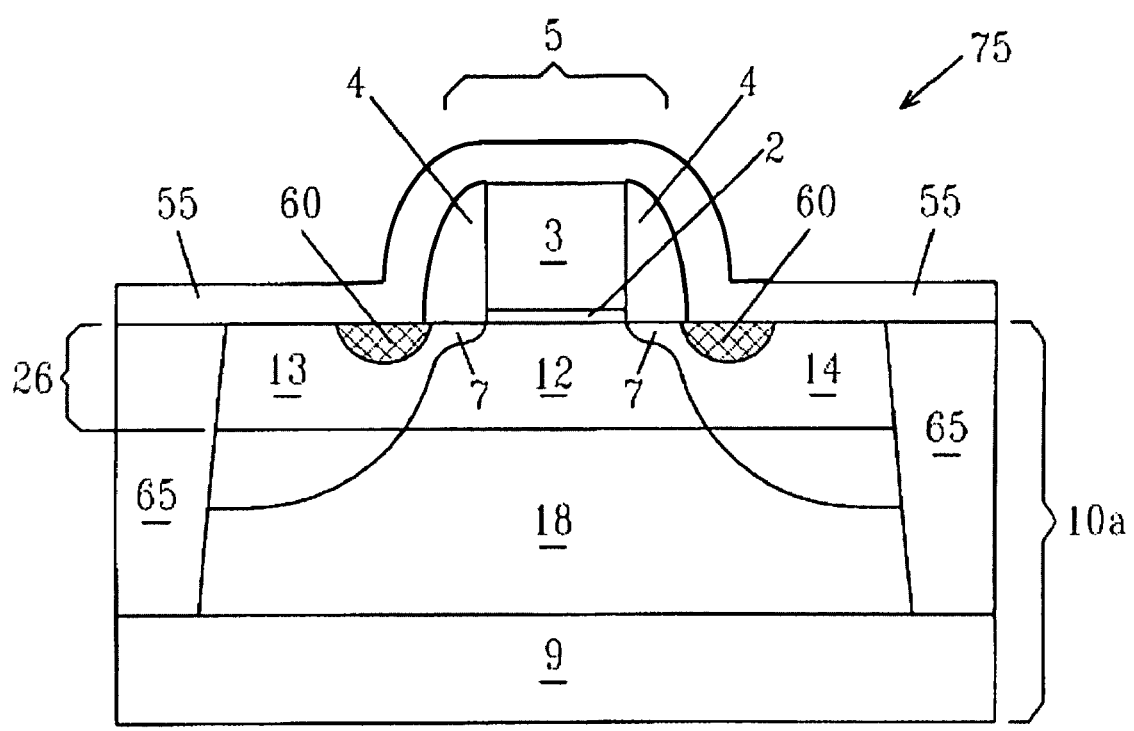
FIG. 3 is a pictorial representation (through a cross-sectional view) of another embodiment of the inventive semiconducting device including a pFET device channel having a uniaxial compressive strain atop a Si:C layer, in which the uniaxial compressive strain is in a direction parallel to the device channel.

Referring to FIG. 3, in another embodiment of the present invention, a pFET 75 is provided having a uniaxial compressive strain in the device channel 12 of the substrate 10(a), in which the compressive uniaxial strain is in a direction parallel to the length of the device channel 12. In this embodiment, the uniaxial compressive strain is produced by the combination of the biaxial compressive strained semiconducting layer 26 and a compressive strain inducing liner 55.

The biaxial compressive strained semiconducting layer 26 is epitaxial silicon grown atop a silicon doped with carbon (Si:C) strain inducing layer 18. A biaxial compressive strain is induced in epitaxial silicon grown on a surface formed of a material whose lattice constant is smaller than that of silicon. The lattice constant of carbon is smaller than that of silicon. Epitaxial growth of Si on such a Si:C strain inducing layer 18 yields a Si layer under a biaxial compressive strain, with the underlying Si:C strain inducing layer 18 being essentially unstrained, or relaxed. The term "biaxially compressive" denotes that a compressive strain is produced in a first direction parallel to the device channel 12 and in a second direction perpendicular to the device channel 12, where the magnitude of the strain in the first direction is equal to the magnitude of the strain in the second direction.

The compressive strain inducing liner 55 is similar to the compressive strain inducing liner described above with reference to FIG. 2 and preferably comprises $Si_3N_4$. Referring back to FIG. 3, the compressive strain inducing liner 55 is positioned atop the gate region 5 and the exposed surface of the biaxial compressive strained semiconducting layer 26 adjacent to the gate region 5.

The compressive strain inducing liner 55 produces a uniaxial compressive strain on the device channel 12 ranging from about 100 MPa to about 2000 MPa, in which the direction of the uniaxial strain is parallel to the length of the device channel 12.

Before the compressive strain inducing liner 55 is formed, the device channel 12 is in a biaxial compressive strain; since the magnitude of the strain produced in the direction perpendicular to the device channel 12 is equal the strain produced in the direction parallel to the device channel 12. The application of the compressive strain inducing liner 55 produces a uniaxial strain in the direction parallel the device channel 12, wherein the magnitude of the compressive strain perpendicular to the device channel 12 is less than the magnitude of the compressive strain parallel the device channel 12. Further, the lattice constant within the pFET device 75 perpendicular the device channel 12 is greater than the lattice constant along the device channel 12.

Still referring to FIG. 3, in another embodiment of the present invention, SiGe compressive strain inducing wells 60 are positioned adjacent the device channel 12. The compressive strain inducing wells 60 comprising intrinsically compressive SiGe can be epitaxially grown atop a recessed portion of the biaxial compressive strained semiconducting layer 26 and is similar to the SiGe compressive strain inducing well 60 described with reference to FIG. 2. Preferably, SiGe compressive strain inducing wells 60 encroach underneath the sidewall spacers 4 that abut the gate electrode 3 in the gate region 5.

The method for forming the inventive pFET 75 is now described in greater detail. In a first process step, a stacked structure 10(a) is provided having a biaxial compressive strained semiconducting layer 26 overlying a Si:C strain inducing layer 18, in which the Si:C strain inducing layer 18 is formed atop a Si-containing substrate 9. The Si-containing substrate 9 depicted in FIG. 3 is similar to the Si-containing substrate 9 described above with reference to FIG. 1.

The Si:C strain inducing layer 18 is formed atop the entire Si-containing substrate 9 using an epitaxial growth process, wherein the C content of the Si:C strain inducing layer 18 is less than about 6%, by atomic %, preferably ranging from 0.5% to 4%. Typically, the Si:C strain inducing layer 18 can be grown to a thickness ranging from about 10 nm to about 100 nm.

The biaxial compressive strained semiconducting layer 26 is then formed atop the Si:C strain inducing layer 18. The biaxial compressive strained semiconducting layer 26 comprises an epitaxially grown Si-containing material having lattice dimensions that are larger than the lattice dimensions of the underlying Si:C layer 18. The biaxial compressive strained semiconducting layer 26 can be grown to a thickness that is less than its' critical thickness. Typically, the biaxial compressive strained semiconducting layer 26 can be grown to a thickness ranging from about 10 nm to about 100 nm.

Alternatively, a biaxial compressively strained semiconducting layer 26 can be formed directly atop an insulating layer to provide a strained silicon directly on insulator (SS-DOI) substrate. In this embodiment, a compressively strained semiconducting layer 26 comprising epitaxial Si is grown atop a handling wafer having a Si:C surface. The compressively strained semiconducting layer 26 is then bonded to a dielectric layer of a support substrate using bonding methods, such as thermal bonding. Following bonding, the handling wafer having a Si:C surface is removed using smart cut and etching to provide a biaxial compressive strained semiconducting layer 26 directly bonded to a dielectric layer.

Following the formation of the layered structure 10(a), pFET devices 75 are formed atop the biaxial compressively strained semiconducting layer 26, as described with reference to FIG. 2.

Referring back to FIG. 3, in a next process step, a compressive strain inducing liner 55 is then deposited at least atop the gate region 5 and the exposed surface of the biaxial compressive strained semiconducting layer 26 adjacent to the gate region 5. The compressive strain inducing liner 55 is similar to the compressive strain inducing liner described above with reference to FIG. 2.

Preferably, the compressive strain inducing liner 55 comprises a nitride, such as $Si_3N_4$, wherein the process conditions of the deposition process are selected to provide an intrinsic compressive strain within the deposited layer. For example, plasma enhanced chemical vapor deposition (PECVD) can provide nitride stress inducing liners having a compressive internal stress. The stress state of the deposited nitride stress inducing liner may be set by changing the deposition conditions to alter the reaction rate within the deposition chamber, in which the deposition conditions include $SiH_4/N_2$/He gas flow rate, pressure, RF power, and electrode gap.

Similar to the embodiment depicted in FIG. 2, compressive strain inducing wells 60, preferably comprising intrinsically compressive SiGe, and compressive strain inducing isolation regions 65, preferably comprising intrinsically compressive dielectric fill, may then be formed as depicted in FIG. 3. Preferably, the compressive strain inducing wells 60 encroach underneath the sidewall spacers 4 that abut the gate electrode 3 in the gate region 5.

Figure 4:
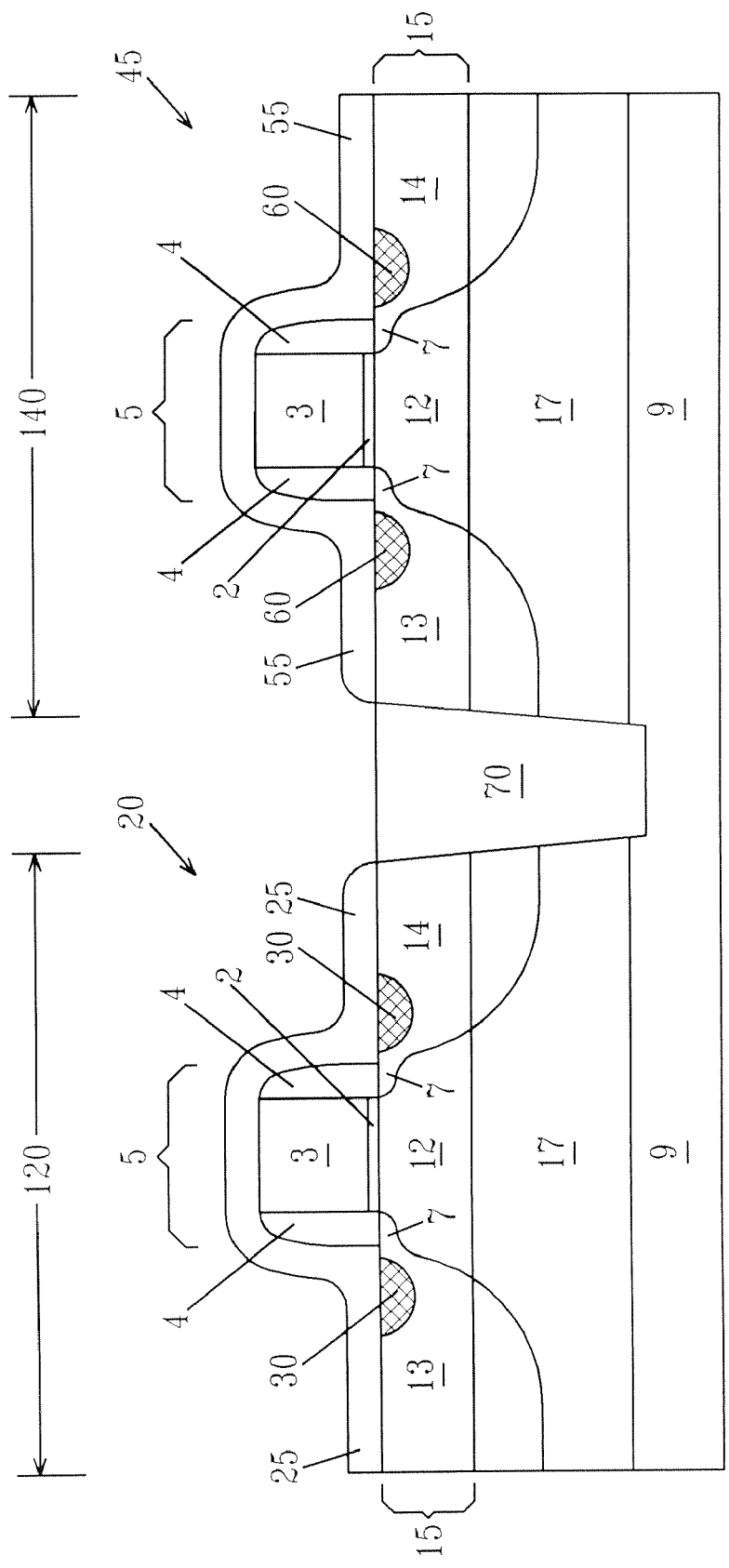
FIG. 4 is a pictorial representation (through a cross-sectional view) of one embodiment of the inventive CMOS structure including the nFET device depicted in FIG. 1 and the pFET device depicted in FIG. 2.

Referring to FIG. 4, in another embodiment of the present invention, a CMOS structure is provided incorporating the nFET devices 20 of the present invention as depicted in FIG. 1, and the pFET devices 45 of the present invention as depicted in FIG. 2, on the same substrate 100. Each nFET device 20 has a device channel 12 in which the lattice constant in the direction parallel to the nFET device channel 12 is larger than the lattice constant in the direction perpendicular to the nFET device channel 12, wherein the lattice constant differential is induced by a tensile uniaxial strain. Each pFET 45 has a device channel 12 in which the lattice constant in the direction perpendicular to the pFET device channel 12 is larger than the lattice constant parallel to the pFET device channel 12, wherein the lattice constant differential is induced by a compressive uniaxial strain. The CMOS structure depicted in FIG. 4 is formed using the above-described methods for producing the nFET device 20 and the pFET device 45.

More specifically, a layered structure 100 is first provided including a biaxial tensile strained semiconducting layer 15 formed overlying a SiGe strain inducing layer 17, as described above with reference to FIG. 1. NFET devices 20 are then formed within an nFET device region 120 of the substrate 100 and pFET devices 45 are then formed within a pFET device region 140 of the substrate 100, wherein the nFET device region 120 is separated from the pFET device region by an isolation region 70. Similar to the previous embodiments, the biaxial strain produced within the pFET device region 140 and the nFET device region 120 may be increased by filling the isolation region 70 with an intrinsically compressive or intrinsically tensile dielectric fill.

The pFET device region 140 and the nFET device region 120 are then selectively processed using conventional block masks. For example, a first block mask is formed atop the pFET device region 140, leaving the nFET device region 120 exposed. The nFET device region 120 is then processed to produce nFET devices 20, a tensile strain inducing liner 25 and tensile strain inducing wells 30, as described above with reference to FIG. 1. The nFET device region 120 and the pFET device region 140 are separated by an isolation region 70, wherein an intrinsically tensile or intrinsically compressive dielectric fill material can increase the biaxial strain within the nFET or pFET device regions 120, 140.

The first block mask is then removed and a second block mask is formed atop the nFET device region 120, leaving the pFET device region 140 exposed. The pFET device region 140 is processed to produce pFET devices 45, a compressive strain inducing liner 55 and compressive strain inducing wells 60, as described above with reference to FIG. 2. The second block mask is then removed.

Figure 5:
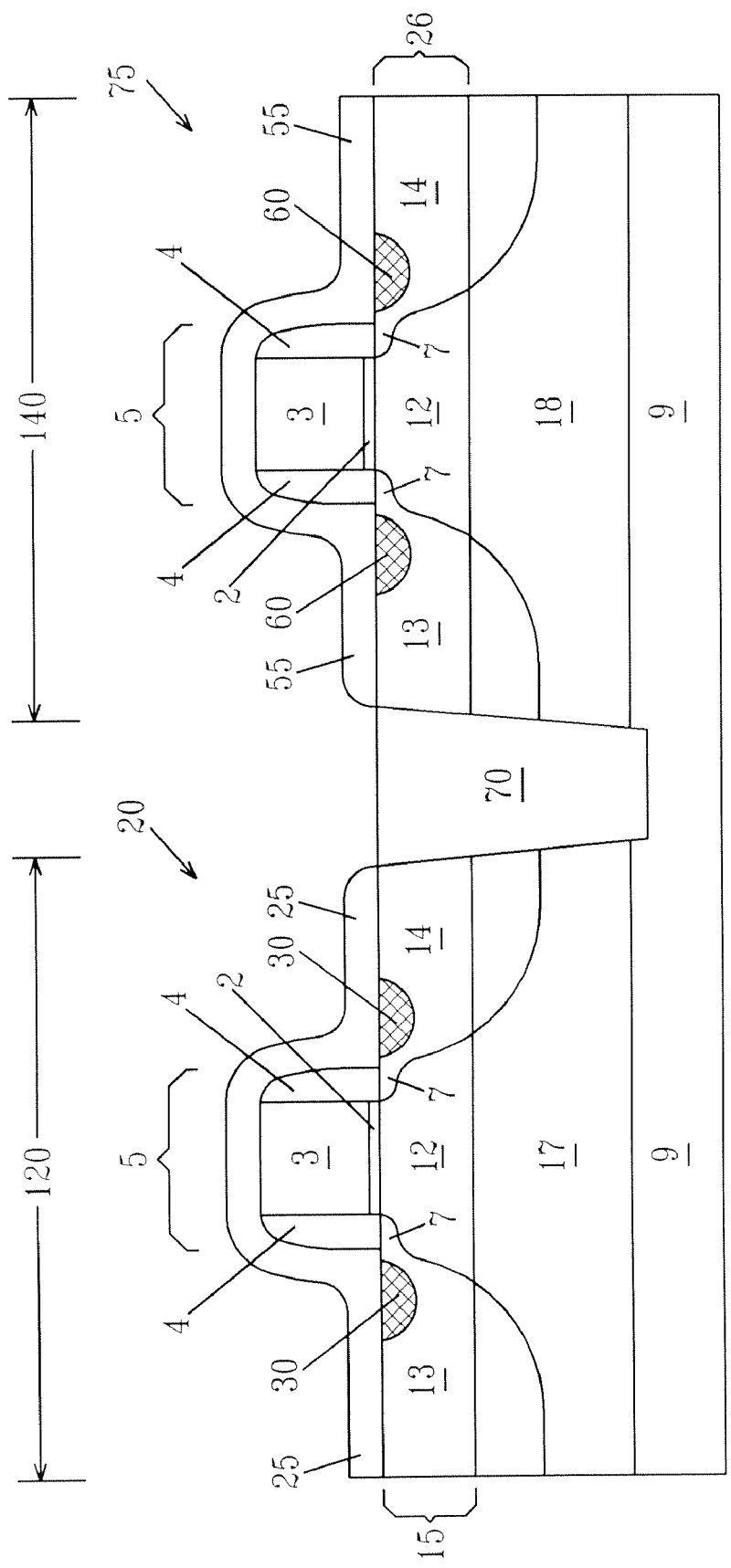
FIG. 5 is a pictorial representation (through a cross-sectional view) of one embodiment of the inventive CMOS structure including the nFET device depicted in FIG. 1 and the pFET device depicted in FIG. 3.

Referring to FIG. 5, in another embodiment of the present invention, a CMOS structure is provided incorporating the nFET device 20, depicted in FIG. 1, and the pFET device 75, depicted in FIG. 3, on the same substrate. The CMOS structure depicted in FIG. 5 provides further enhancement of nFET current drive as well as improvement of pFET current drive on the same substrate 105.

The CMOS structure depicted in FIG. 5 is formed using the above-described methods for producing nFET devices 20, as depicted in FIG. 1, and the pFET devices 75, as depicted in FIG. 3, wherein block masks are utilized to selectively process the portion of the CMOS structure in which the nFET devices 20 and the pFET devices 75 are formed.

First, a strained Si substrate 105 is provided having at least a biaxial compressively strained semiconducting layer 26 overlying a Si:C strain inducing layer 18 in the pFET device region 140 and a biaxial tensile strained compressive layer 15 overlying a SiGe strain inducing layer 17 in the nFET device region 120. The strained Si substrate 105 may be formed using deposition, epitaxial growth, photolithography and etching. A more detailed description of the formation of a biaxial strained Si substrate 105 comprising a compressively strained semiconducting layer 26 and a tensile strained semiconducting layer 15 is provided in co-assigned U.S. patent application Ser. No. 10/859,736, filed Jun. 3, 2004 entitled STRAINED Si ON MULTIPLE MATERIALS FOR BULK OR SOI SUBSTRATE, the entire content of which is incorporated herein by reference.

In a next process step, a first block mask is formed atop the pFET device region 140, leaving the biaxial tensile strained semiconducting layer 15 in the nFET device region 120 exposed. The biaxial tensile strained semiconducting layer 15 is processed to provide nFET devices 20 comprising a tensile strain inducing liner 25 and tensile strain inducing wells 30, wherein a tensile uniaxial strain is produced within the nFET device channels 12. The nFET devices 20 are processed in accordance with the method described above with reference to FIG. 1.

Following the formation of the nFET devices 20, the first block mask is stripped to expose the biaxial compressive strained semiconducting layer 26 and a second block mask is formed atop the nFET devices 20 positioned in the biaxial tensile strained semiconducting layer 15. The biaxial compressively strained semiconducting layer 26 is processed to provide pFET devices 75 comprising a compressive strain inducing liner 55 and compressive strain inducing wells 60, in which a uniaxial compressive strain is produced within the device channel 12 of the pFET devices 75. The pFET devices 75 are processed in accordance with the method described above with reference to FIG. 3.

Figure 6:
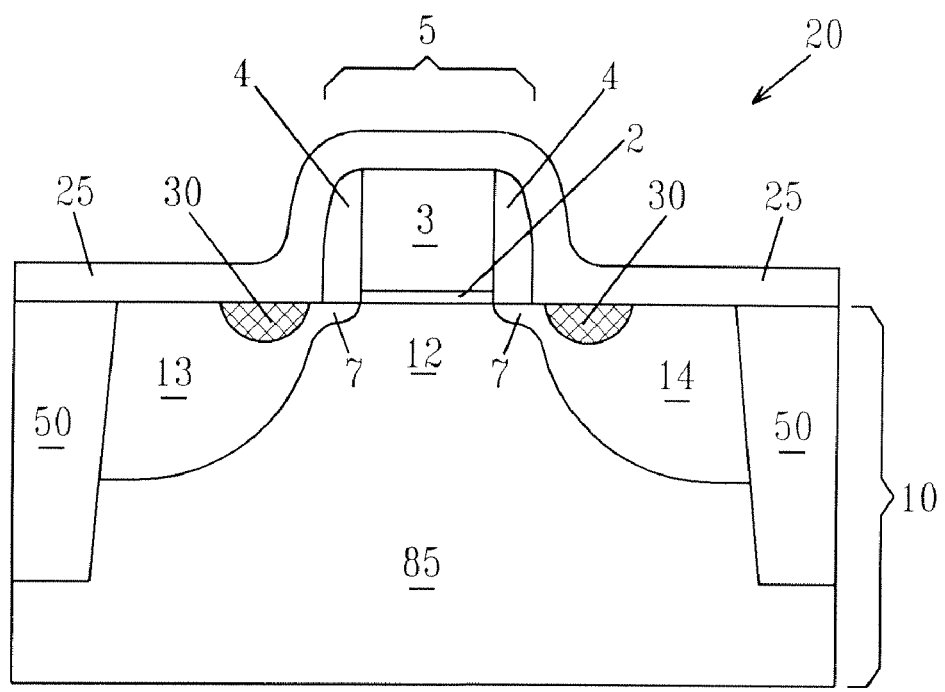
FIG. 6 is a pictorial representation (through a cross-sectional view) of another embodiment of the inventive semiconducting device including a nFET device channel having a uniaxial compressive strain formed atop a relaxed semiconducting substrate.

Referring to FIG. 6, in another embodiment of the present invention, a n-type field effect transistor (nFET) 20 is provided having a uniaxial tensile strain in the device channel 12 portion of a relaxed substrate 85 is which the uniaxial tensile strain is in a direction parallel to the length of the device channel 12. The uniaxial tensile strain along the device channel 12 of the nFET device 20 is produced by the combination of a tensile strain inducing liner 25 and a tensile strain inducing well 30.

The term "relaxed substrate" denotes a substrate that does not have an internal strain, in which the lattice dimension in the direction parallel to the channel plane (x-direction), perpendicular to the channel plane (y-direction) and out of the channel plane (z-direction) are the same. The relaxed substrate 85 may comprise any semiconducting material, including but not limited to: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III-V and II-VI semiconductors. The relaxed substrate 85 may also be silicon-on-insulator substrates (SOI) or SiGe-on-insulator (SGOI) substrates. The thickness of the relaxed substrate 85 is inconsequential to the present invention. Preferably, the relaxed substrate 85 comprises a Si-containing material.

The tensile strain inducing liner 25, preferably comprises $Si_3N_4$, and is positioned atop the gate region 5 and the exposed surface of the relaxed substrate 85 adjacent to the gate region 5. The tensile strain inducing liner 25 may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The tensile strain inducing liner 25 may have a thickness ranging from about 10 nm to about 500 nm, preferably being about 50 nm. The tensile strain inducing liner 25 may be deposited by plasma enhanced chemical vapor deposition (PECVD) or rapid thermal chemical vapor deposition (RTCVD).

Preferably, the tensile inducing liner 25 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state of the nitride stress including liners deposited by PECVD can be controlled by changing the deposition conditions to alter the reaction rate within the deposition chamber. More specifically, the stress state of the deposited nitride strain inducing liner may be set by changing the deposition conditions such as: $SiH_4/N_2$/He gas flow rate, pressure, RF power, and electrode gap. In another example, rapid thermal chemical vapor deposition (RTCVD) can provide nitride tensile strain inducing liners 25 having an internal tensile strain. The magnitude of the internal tensile strain produced within the nitride tensile strain inducing liner 25 deposited by RTCVD can be controlled by changing the deposition conditions. More specifically, the magnitude of the tensile strain within the nitride tensile strain inducing liner 25 may be set by changing deposition conditions such as: precursor composition, precursor flow rate and temperature.

The tensile strain inducing wells 30 are positioned adjacent the device channel 12 in respective source and drain regions 13, 14. The tensile strain inducing well 30 can comprise silicon doped with carbon (Si:C) or silicon germanium doped with carbon (SiGe:C). The tensile strain inducing wells 30 comprising intrinsically tensile Si:C can be epitaxially grown atop a recessed portion of the relaxed substrate 85.

The tensile strain inducing wells 30 in combination with the tensile strain inducing liner 25 produces a uniaxial tensile strain within the device channel 12 in a direction parallel with the nFET device channel 12. The combination of the tensile strain inducing liner 25 and the strain inducing wells 30 produces a uniaxial compressive strain on the device channel 12 ranging from about 100 MPa to about 2000 MPa, in which the direction of the uniaxial strain is parallel to the length of the device channel 12. The method for forming the structure depicted in FIG. 1 is applicable for providing the structure depicted in FIG. 6 with the exception that the method of forming the structure depicted in FIG. 6 includes a relaxed substrate 85 as opposed to a strained substrate of the previous embodiment.

Figure 7:
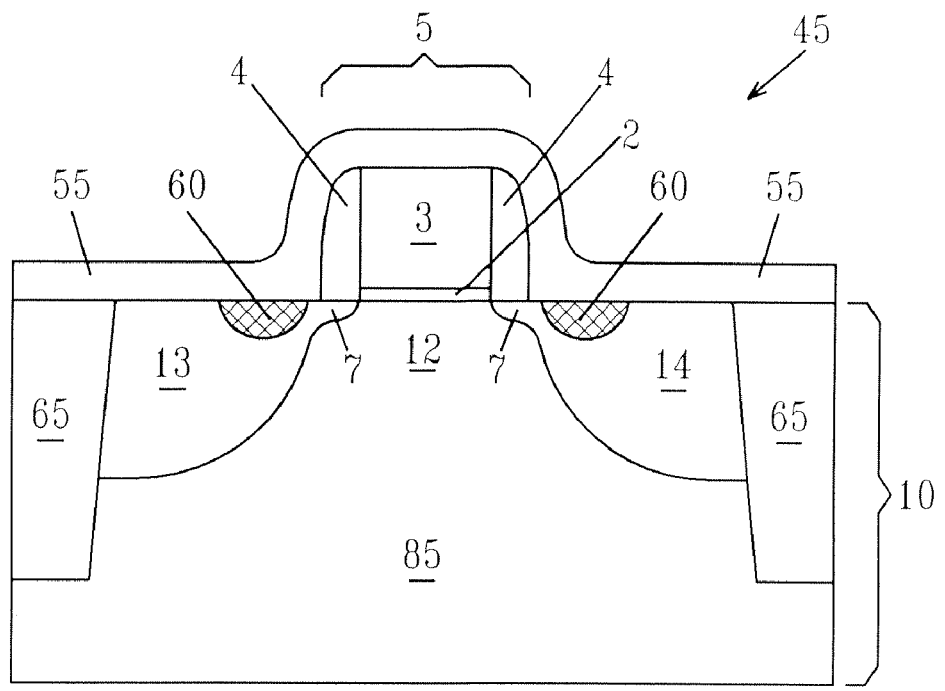
FIG. 7 is a pictorial representation (through a cross-sectional view) of another embodiment of the inventive semiconducting device including a pFET device channel having a uniaxial tensile strain formed atop a relaxed semiconducting substrate.

Referring to FIG. 7, in another embodiment of the present invention, a p-type field effect transistor (pFET) 45 is provided having a uniaxial compressive strain in the device channel 12 portion of a relaxed substrate 85 is which the uniaxial compressive strain is in a direction parallel to the length of the device channel 12. A compressive strain inducing liner 55 in combination with compressive strain inducing wells 60 produces a compressive uniaxial strain along the device channel 12 portion of the relaxed substrate 85, wherein the uniaxial compressive strain parallel to the device channel provides carrier mobility enhancements in pFET devices 45.

The relaxed substrate 85 is similar to the relaxed substrate depicted in the FIG. 6. The application of the compressive strain inducing liner 55 in combination with the compressive strain inducing wells 60 produces a uniaxial compressive strain in a direction parallel to the device channel 12. Therefore, the lattice constant within the pFET device 45 across the device channel 12 is greater than the lattice constant along the device channel 12.

The compressive strain inducing liner 55 may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The compressive strain inducing liner 55 may have a thickness ranging from about 10 nm to about 100 nm, preferably being about 50 nm. The compressive strain inducing liner 55 may be deposited by plasma enhanced chemical vapor deposition (PECVD).

Preferably, the compressive strain inducing liner 55 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having a compressive internal stress. The stress state of the deposited nitride stress inducing liner may be set by changing the deposition conditions to alter the reaction rate within the deposition chamber, in which the deposition conditions include $SiH_4/N_2$/He gas flow rate, pressure, RF power, and electrode gap.

The compressive strain inducing wells 60 are positioned adjacent the device channel 12 in respective source and drain regions 13, 14. The compressive strain inducing well 60 can comprise SiGe. The compressive strain inducing wells 60 comprising intrinsically compressive SiGe can be epitaxially grown atop a recessed portion of the relaxed substrate 85.

The combination of the compressive strain inducing liner 55 and the compressive strain inducing wells 60 produces a uniaxial compressive strain on the device channel 12 ranging from about 100 MPa to about 2000 MPa, in which the direction of the uniaxial compressive strain is parallel to the length of the device channel 12. The method for forming the structure depicted in FIG. 2 is applicable for providing the structure depicted in FIG. 7 with the exception that the method of forming the structure depicted in FIG. 7 includes a relaxed substrate 85.

Figure 8:
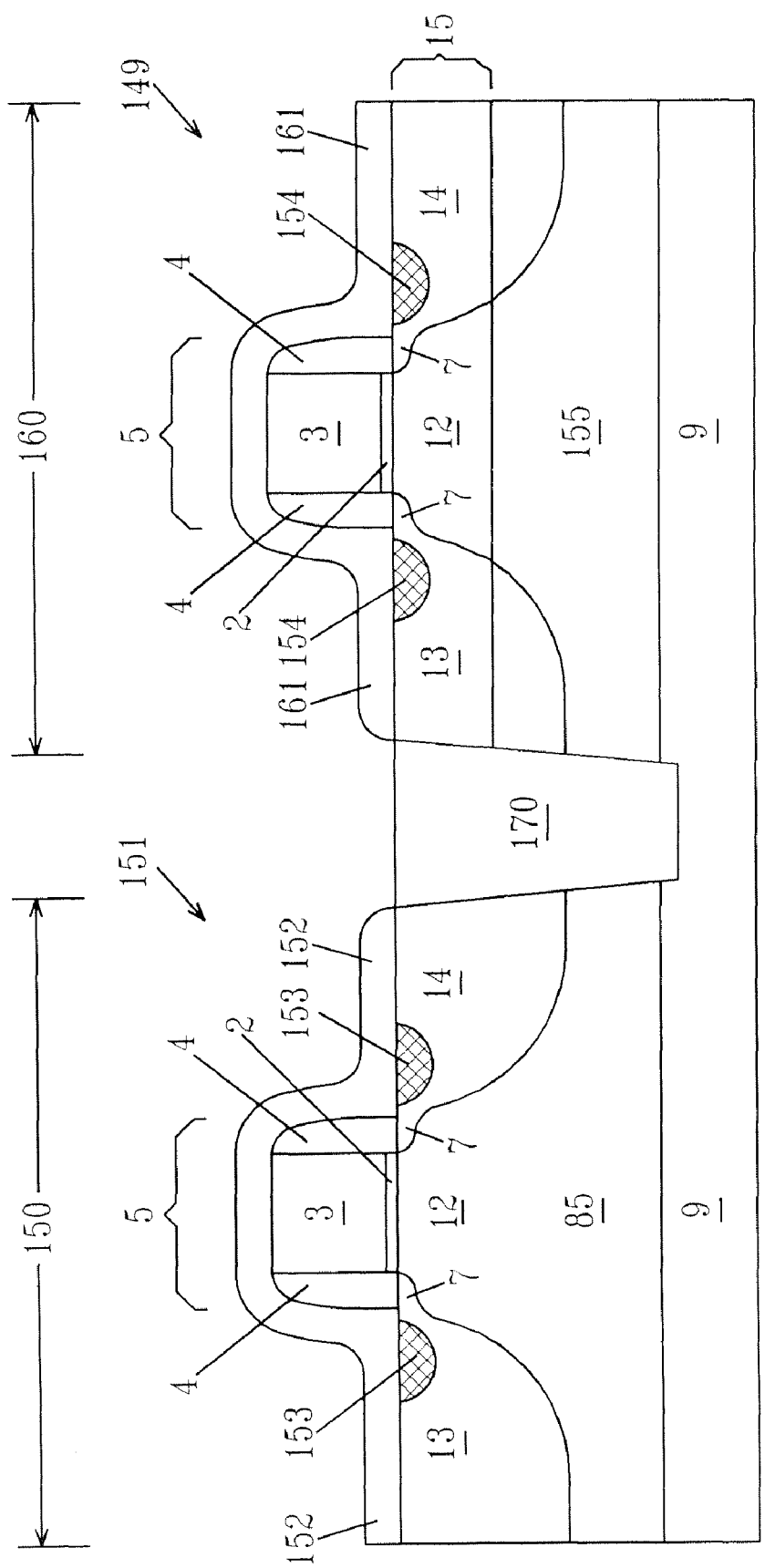
FIG. 8 is a pictorial representation (through a cross-sectional view) of one embodiment of the inventive CMOS structure including a relaxed substrate region and a biaxially strained semiconductor region.

Referring to FIG. 8, in another embodiment of the present invention, a CMOS structure is provided incorporating at least one field effect transistor (FET) 151 having a uniaxial strain along the device channel 12 of a relaxed substrate region 150 and at least one FET 149 having a uniaxial strain along the device channel 12 of a biaxially strained substrate region 160.

The uniaxial strain in the relaxed substrate region 150 is provided by the combination of a strain inducing liner 152 atop the FET 151 and strain inducing wells 153 adjacent to the FET 151. The strain inducing liner 152 and strain inducing wells 153 may be processed to induce a tensile strain on the device channel 12 of the relaxed semiconducting surface 85, as described above with reference to FIG. 6, or to induce a compressive strain on the device channel 12 of the relaxed semiconducting surface 85, as described above with reference to FIG. 7.

The uniaxial strain in the biaxially strained substrate region 160 is provided by the combination of a strain inducing layer 155 underlying the device channel 12 with a strain inducing liner 161 and/or strain inducing wells 154. The strain inducing layer 155 within the biaxially strained substrate region 160 may comprise silicon doped with carbon (Si:C) or silicon germanium doped with carbon (SiGe:C) and provide a compressive biaxially strained semiconducting surface, as described above with reference to FIG. 3, or silicon germanium (SiGe) and provide a tensile biaxially strained semiconducting surface, as described above with reference to FIGS. 1 and 2. Isolation regions 170 comprising intrinsically tensile strained or intrinsically compressively strained dielectric fill can increase the biaxial strain produced within the biaxially strained substrate region 160.

The strain inducing wells 154 within the biaxially strained substrate region 160 may comprise silicon germanium (SiGe), hence providing a compressive uniaxial strain to the device channel 12 of the biaxially strained substrate region 160, as described above with reference to FIGS. 2 and 3. The strain inducing wells 154 may also comprise silicon doped with carbon (Si:C) or silicon germanium doped with carbon (SiGe:C), hence providing a tensile uniaxial strain to the device channel 12 of the biaxially strained substrate region 160, as described above with reference to FIG. 1. The strain inducing liner 161 may be formed atop the FET 149 in the biaxially strained substrate region 160 to provide a tensile or compressive uniaxial strain to the device channel 12 of the biaxially strained substrate region 160, as described above with reference to FIGS. 1-3.

The CMOS structure depicted in FIG. 8 may be formed using a method similar to the method used for providing the CMOS structure depicted in FIG. 7, with the exception that a strain inducing layer is not present in the relaxed substrate region 150. Alternatively, a strain inducing layer may be present in the relaxed substrate region 150 so long as the semiconducting surface overlying the strain inducing layer is grown to a thickness greater than its' critical thickness.

The following examples have been provided to further illustrate the present invention and to demonstrate some advantages that can arise therefrom. The examples have been provided for illustrative purposes only and therefore the present invention should not be limited to the examples depicted below.

EXAMPLE 1

Figure 9A:
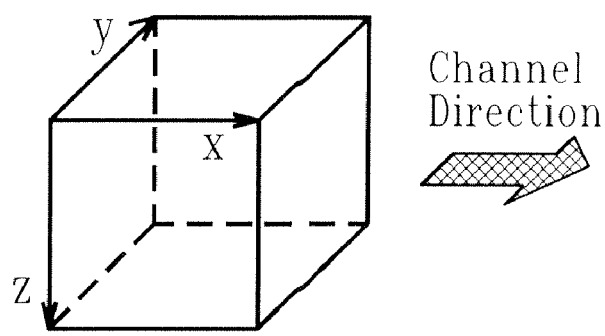
FIGS. 9(a)-9(c) are pictorial representations of the relationship between lattice dimension and uniaxial strain parallel to the device channel in compression and tension.
Figure 9B:
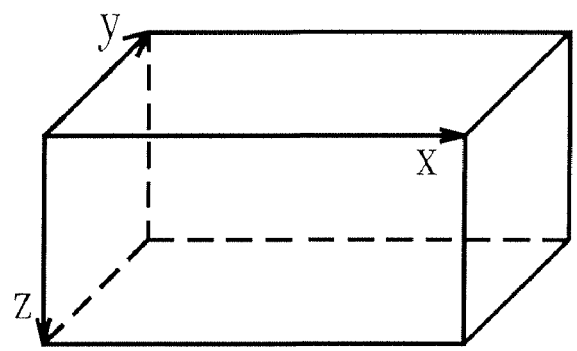
Figure 9C:
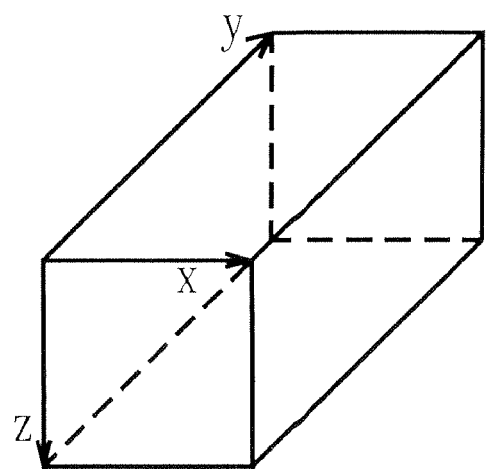

Formation of Compressive or Tensile Dielectric Capping Layer atop Biaxially Strained SGOI Substrate In this example, a dielectric capping layer (compressive or tensile strain inducing layer) was used to enhance the drive current by introducing a uniaxial strain along the FET channel. When such a dielectric capping layer is deposited over an SGOI FET, the lattice structure was distorted in response to the combination of a biaxial tensile strain and a smaller uniaxial tensile or compressive stress. FIG. 9(a) depicts a schematic description of biaxial tension strained Si, in which the longitudinal lattice dimension (x-direction, parallel to the channel) was equal to the transverse lattice dimension (y-direction, in the same plane and perpendicular to the device channel) and the normal lattice dimension (z-direction, out of the channel plane). FIG. 9(b) depicts the lattice symmetry of the biaxial tension strained Si substrate depicted in FIG. 9(a) with a superimposed uniaxial tensile strain along the channel resulting in a larger longitudinal lattice dimension than the transverse lattice dimension and the normal lattice dimension. FIG. 9(c) depicts the lattice symmetry of the biaxial tension strained Si substrate depicted in FIG. 9(a) with a superimposed uniaxial compressive strain along the channel resulting in a larger transverse lattice dimension than the longitudinal lattice dimension and the normal lattice dimension.

Devices were fabricated with stress inducing dielectric capping layers (strain inducing liners) on 300 mm diameter thermally mixed ultra-thin SGOI substrates. The substrates displayed excellent uniformity in Ge mole fraction [Ge] and thickness across the wafer (Std. Dev of [Ge] was 0.18% across the 300 mm diameter substrate and the Std. Dev of the substrate thickness was 0.85 nm across the 300 mm diameter substrate). FETs (n-type and p-type) were provided on the substrates having a 55 nm channel length. Tensile or compressive dielectric capping layers (strain inducing liners) were then formed atop the FETs.

Figure 10:
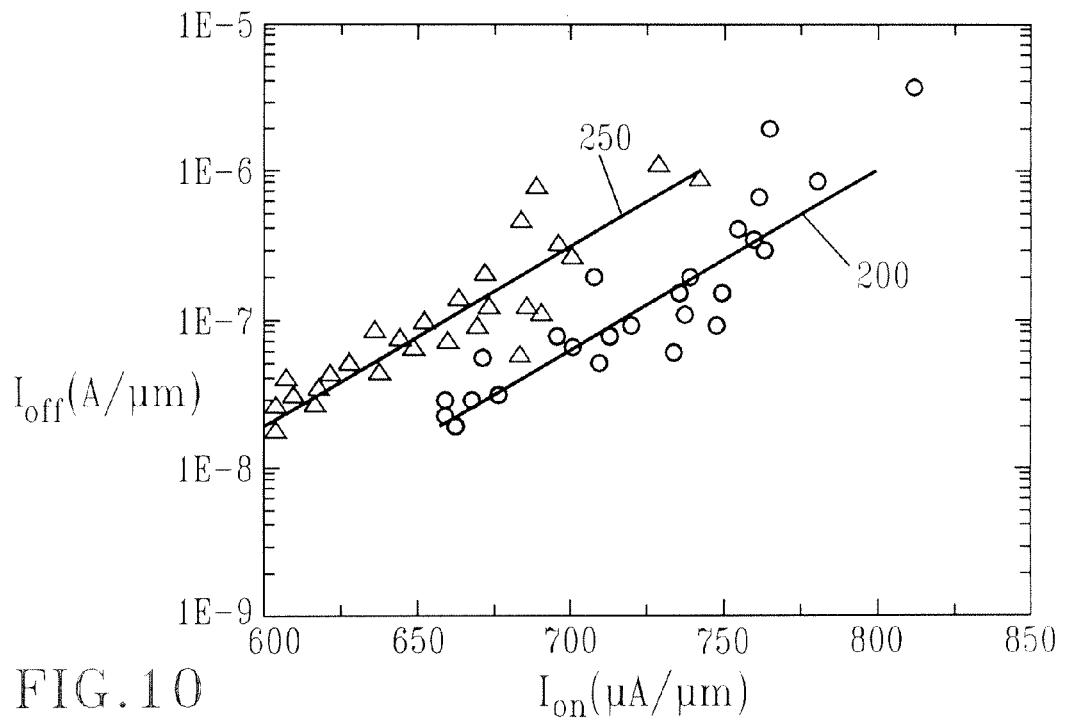
FIG. 10 is a plot of $I_{off}$ v. $I_{on}$ for nFET devices having tensile strain inducing and compressive strain inducing dielectric layers (tensile strain inducing and compressive strain inducing liners).

FIG. 10 depicts $I_{on}$ v. $I_{off}$ measurements for nFET devices 200 having tensile longitudinal strain (parallel to the device channel), super-imposed by a tensile strain inducing dielectric capping layer, and nFET devices 250 having a compressive longitudinal strain parallel to the device channel, super imposed by a compressive strain inducing dielectric capping layer. A power supply voltage of 1.0 V was applied to the nFET devices provided the $I_{on}$ v. $I_{off}$ data depicted in FIG. 10. Uniaxial tension further enhanced current drive of strained Si nFET devices. FIG. 10 depicts that an SGOI nFET can obtain approximately a 10% enhancement in drive current with a change of the dielectric capping layer from a compressive strain inducing dielectric capping layer to a tensile strain inducing dielectric capping layer.

Figure 11:
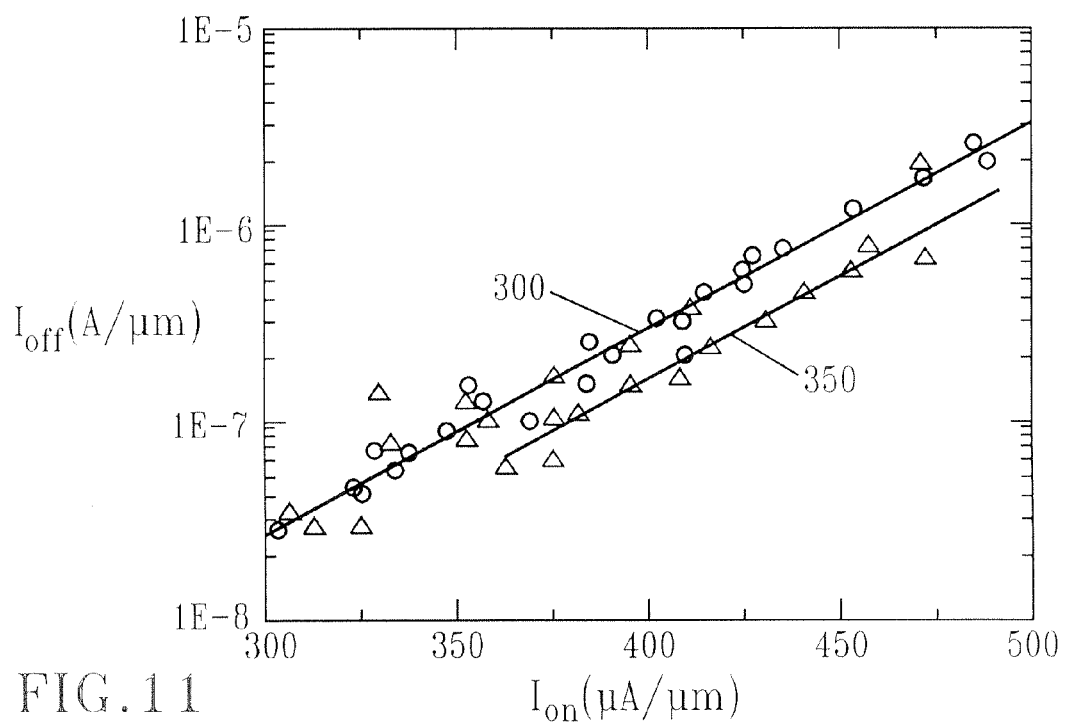
FIG. 11 is a plot of $I_{off}$ v. $I_{on}$ for pFET devices having tensile strain inducing and compressive strain inducing dielectric layers (tensile strain inducing and compressive strain inducing liners).

Referring to FIG. 11, $I_{on}$ v. $I_{off}$ was then measured for pFET devices 300 having tensile longitudinal strain (parallel to the device channel), super-imposed by a tensile strain inducing dielectric capping layer, and pFET devices 350 having a compressive longitudinal strain (parallel to the device channel), super-imposed by a compressive strain inducing dielectric capping layer. A power supply voltage of 0.9 V was applied to the pFET devices providing the $I_{on}$ v. $I_{off}$ data depicted in FIG. 11. Uniaxial compression further enhances current drive of strained Si pFET devices. FIG. 11 depicts that an SGOI pFET can obtain approximately a 5% enhancement in drive current with a change of the dielectric capping layer from a tensile strain inducing dielectric capping layer to a compressive strain inducing dielectric capping layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconducting device comprising:
    a semiconducting substrate, wherein said semiconducting substrate comprises a biaxial tensile strain induced by an underlying strain inducing layer comprising SiGe having Ge present in a concentration ranging from about 5% to about 50%;
    a source region and a drain region located within said semiconducting substrate;

at least one gate region including a gate conductor atop a device channel portion of said semiconducting substrate, said device channel portion separating said source and drain regions;

a sidewall spacer abutting each gate region;

strain inducing wells adjacent said at least one gate region, said strain inducing wells comprising silicon doped with carbon or silicon germanium doped with carbon, wherein each of said strain inducing wells is embedded in and surrounded by said source region or said drain region and comprises a different material than said source and drain regions and top surfaces of said strain inducing wells contact bottom surfaces of said sidewall spacer, wherein at least some portion of said strain inducing wells is located in an undercut area directly beneath said sidewall spacer; and a strain inducing liner positioned directly on said straining inducing wells and top surfaces of said source region and said drain region, wherein said strain inducing liner comprises an oxide, a doped oxide, a nitride, $Al_2O_3$, $HfO_2$, $ZrO_2$, or HfSiO, wherein said strain inducing liner and said strain inducing wells in said semiconducting substrate introduce a uniaxial strain in tension in the device channel portion in a direction parallel to a length of said device channel portion.

\* \* \* \* \*